US008866118B2

(12) United States Patent
Nardi et al.

(10) Patent No.: US 8,866,118 B2
(45) Date of Patent: Oct. 21, 2014

(54) MORPHOLOGY CONTROL OF ULTRA-THIN MEOX LAYER

(71) Applicants: Intermolecular Inc., San Jose, CA (US); Kabushiki Kaisha Toshiba, Tokyo (JP); SanDisk 3D LLC, Milpitas, CA (US)

(72) Inventors: Federico Nardi, Palo Alto, CA (US); Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 27 days.

(21) Appl. No.: 13/724,126

(22) Filed: Dec. 21, 2012

(65) Prior Publication Data

US 2014/0175357 A1 Jun. 26, 2014

(51) Int. Cl.
*H01L 29/02* (2006.01)
*H01L 45/00* (2006.01)

(52) U.S. Cl.
CPC .............. *H01L 45/16* (2013.01); *H01L 45/146* (2013.01)
USPC ...... 257/2; 257/3; 257/4; 257/5; 257/E29.002; 438/102; 438/103; 438/104; 365/163

(58) Field of Classification Search
USPC .................. 257/1–5, E29.002; 438/102–104; 365/148, 163
See application file for complete search history.

(56) References Cited

U.S. PATENT DOCUMENTS

| 5,810,923 | A | 9/1998 | Yano |
| 7,402,456 | B2 | 7/2008 | Zhuang |
| 7,608,467 | B2 | 10/2009 | Wu |
| 7,666,526 | B2 | 2/2010 | Chen et al. |
| 2007/0187772 | A1 | 8/2007 | Ahn |
| 2007/0257257 | A1 | 11/2007 | Cho et al. |
| 2012/0126195 | A1* | 5/2012 | Ignatiev et al. ................... 257/2 |

OTHER PUBLICATIONS

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

Kim, S., et al.; Dielectric and Electrode Thin Films for StackCell Structured DRAM Capacitors with Sub 50nm Design Rules; Sep. 19, 2007; EMRS; Warsaw University of Technology.

Seo, S., et al.; Reproducible resistance switching in polycrystalline NiO films; Dec. 6, 2004; American Institute of Physics; Applied Physics Letters vol. 85 No. 23.

(Continued)

*Primary Examiner* — Jami M Valentine

(57) ABSTRACT

A nonvolatile memory device contains a resistive switching memory element with improved device switching performance and life and methods for forming the same. The nonvolatile memory device has a first layer on a substrate, a resistive switching layer on the first layer, and a second layer. The resistive switching layer is disposed between the first layer and the second layer and the resistive switching layer comprises a material having the same morphology as the top surface of the first layer. A method of forming a nonvolatile memory element in a ReRAM device includes forming a resistive switching layer on a first layer and forming a second layer, so that the resistive switching layer is disposed between the first layer and the second layer. The resistive switching layer comprises a material formed with the same morphology as the top surface of the first layer.

16 Claims, 9 Drawing Sheets

(56) References Cited

OTHER PUBLICATIONS

Seo, S., et al.; Electrode dependence of resistance switching in polycrystalline NiO films; Jan. 1, 2005; American Institute of Physics; Applied Physics Letters 87 263507 2005.

Beck, A., et al.; Reproducible Switching Effect in Thin Oxide Films for Memory Applications; Jul. 3, 2000; IBM—International Business Machines Corporation; Applied Physics Letters vol. 77 No. 1 pp. 139141.

Gibbons, J.F., et al.; Switching Properties of Thin NiO Films; Jan. 1, 1964; Stanford Electronics Laboratories; SolidState Electronics vol. 7 pp. 785797.

Sim, H., et al.; ResistanceSwitching Characteristics of Polycrystalline Nb2O5 for Nonvolatile Memory Application; May 1, 2005; IEEE; Electron Device Letters vol. 26 May 5 pp. 292294.

Jo, Y., et al.; Reverse Resistance Switching in Polycrystalline Nb2O5 Films; Jan. 1, 2010; Korea Basic Science institute; Thin Solid Films pp. 56765678.

Lopes, J., et al.; Amorphous Lanthanum Lutetium Oxide Thin Films as an Alternative Highk Gate Dielectric; ; American Institute of Physics; Applied Physics Letters pp. 8991.

Yu, S., et al.; Improved Uniformity of Resistive Switching Behaviors in HfO2 Thin Films with Embedded Al Layers; Jan. 1, 2010; CNSE; Electochemical and SolidState Letters H36H38.

Lohneysen, L., et al.; LowTemperature Thermal Conductiviity of Amorphous Germanium; Nov. 28, 1977; Physikalisches Institut des Universitat zu Koln, Eoln, Germany; Physical Review Letters vol. 39 No. 22 pp. 14201423.

Chen, Y-S., et al.; An Ultrathin FormingFree HfOx Resistance Memory With Excellent Electrical Performance; Dec. 1, 2012; IEEE; IEEE Electron Device Letters vol. 31 No. 12.

* cited by examiner

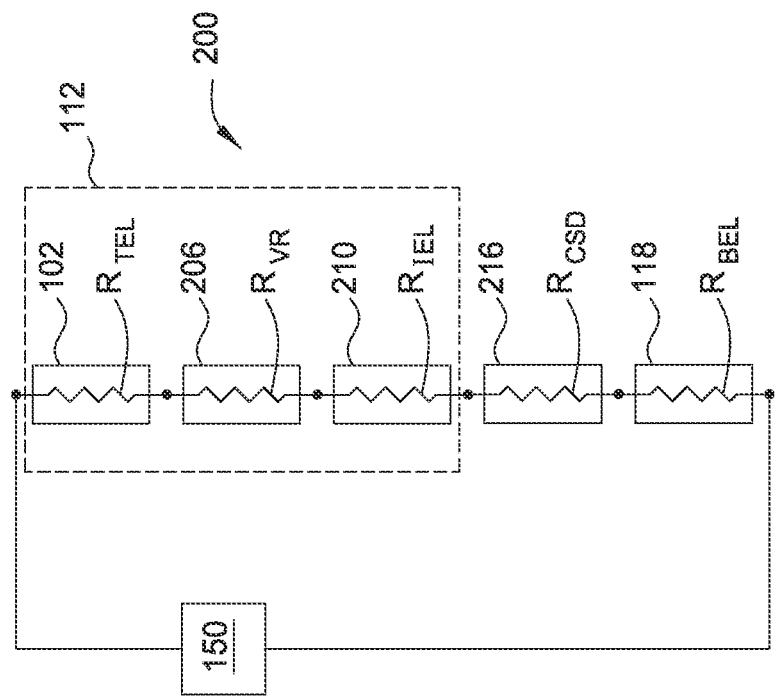
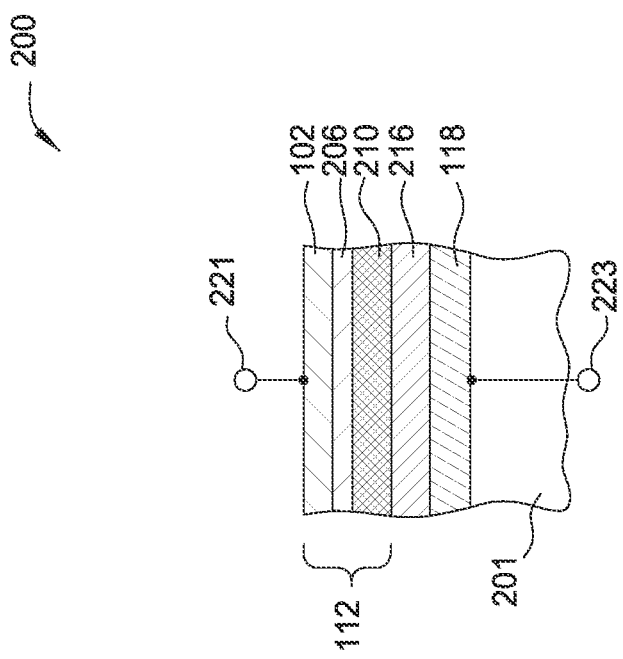

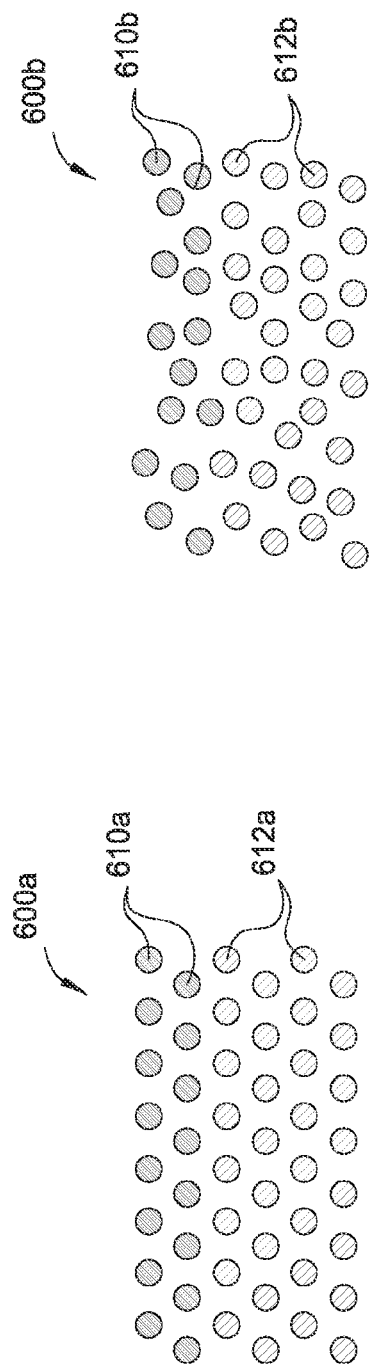
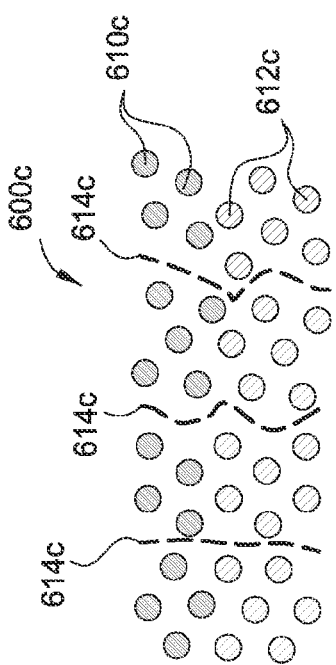
FIG. 6A
FIG. 6B
FIG. 6C

MORPHOLOGY CONTROL OF ULTRA-THIN MEOX LAYER

BACKGROUND OF THE INVENTION

1. Field of the Invention

This invention relates to nonvolatile memory elements, and more particularly, to methods for forming resistive switching memory elements used in nonvolatile memory devices.

2. Description of the Related Art

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

It is believed that conventional films used to form resistive switching layers in resistive switching nonvolatile memory provide a reversible creation/dissolution of a conductive filament through the resistive switching material between two layers serving as electrodes. The physical and chemical properties of the resistive switching layer determine the amount of power needed to switch the resistance states of such films.

Moreover, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set and reset "on" and "off" states of the device to minimize overall power consumption of the memory chip as well as resistive heating of the device and cross-talk between adjacent devices.

Moreover, as nonvolatile memory device sizes shrink it becomes increasingly necessary to assure that the "set" and "reset" currents used to change the state of the memory element are not so large as to require higher voltage transistors for chip control circuitry, as well as to minimize damage to or alter the electrical or physical properties of the one or more layers found in the formed memory device. A large current flowing through the current carrying lines in a memory array can undesirably alter or disturb the memory state of other interconnected devices or possibly damage portions of the adjacent connected devices, due to an appreciable amount of "cross-talk" created between them.

There is a need to limit and/or minimize the required current used to program the logic states of each of the interconnected devices in an effort to reduce chip overall power consumption as well as improve device longevity and reduce the possibility of cross-talk between adjacent connected devices, which can alter a nonvolatile memory device's state. It is also desirable to form a nonvolatile memory device that has low programming currents when switching the device between the "on" and "off" states. Therefore, it is desirable to form a nonvolatile memory device that requires low programming currents to change the device between the "on" and "off" states.

SUMMARY OF THE INVENTION

Embodiments according to the invention generally relate to a resistive switching nonvolatile memory device having a resistive switching layer and methods of forming the resistive switching layer. In some embodiments, a nonvolatile memory element includes a first layer on a substrate, a resistive switching layer on the first layer, and a second layer. The resistive switching layer is disposed between the first layer and the second layer and the resistive switching layer comprises a material having the same morphology as the first layer.

In some embodiments, the method of forming a nonvolatile memory element in a ReRAM device includes forming a resistive switching layer on a first layer and forming a second layer, so that the resistive switching layer is disposed between the first layer and the second layer. The resistive switching layer comprises a material having the same morphology as the first layer.

BRIEF DESCRIPTION OF THE DRAWINGS

So that the manner in which the above recited features can be understood in detail, a more particular description may be had by reference to embodiments, some of which are illustrated in the appended drawings. It is to be noted, however, that the appended drawings illustrate only typical embodiments and are therefore not to be considered limiting of its scope, and may admit to other equally effective embodiments.

FIG. 4A is a schematic side cross-sectional view of a memory element disposed in a nonvolatile memory device.

FIG. 4B is a schematic representation of an electrical circuit formed in the memory element illustrated in FIG. 3A.

FIG. 6A is a schematic depiction of a resistive switching layer and an underlying layer, each having a crystalline morphology.

FIG. 6B is a schematic depiction of a resistive switching layer and an underlying layer, each having an amorphous morphology.

FIG. 6C is a schematic depiction of a resistive switching layer and an underlying layer, each having a polycrystalline morphology.

Figure 1:
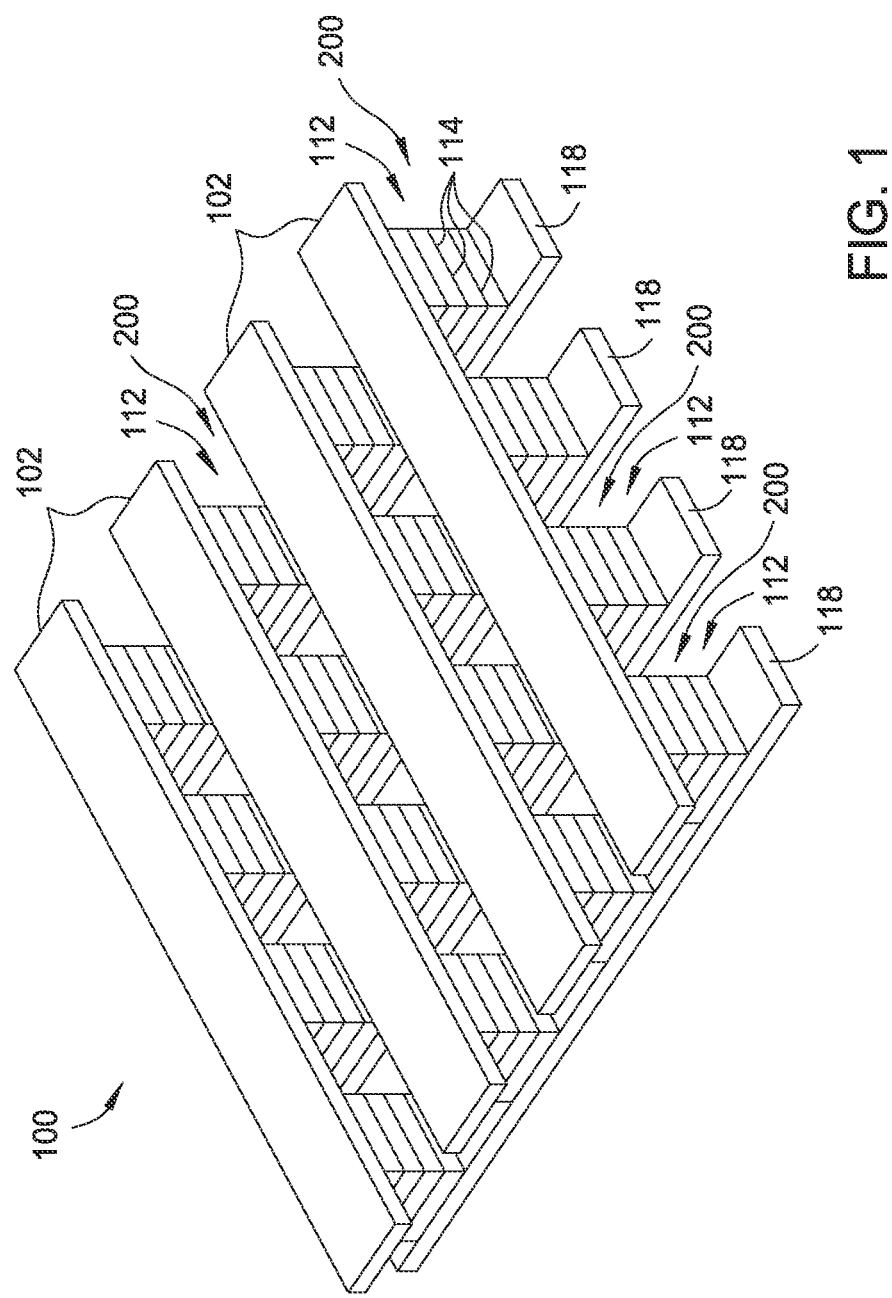
FIG. 1 is a perspective view of a memory array of memory devices.

While the foregoing is directed to embodiments described herein, other and further embodiments may be devised without departing from the basic scope thereof, and the scope thereof is determined by the claims that follow.

DETAILED DESCRIPTION

Embodiments generally described herein include a method of forming a nonvolatile memory device that contains a resistive switching memory element that has an improved device switching performance and increased usable lifetime. Embodiments provide a resistive switching layer whose morphology can be controlled by the morphology of the underlying layer in the nonvolatile memory element. The underlying layer may not only help control morphology of an overlying material, but it also influences the inter-atomic distance of the overlying material i.e. the underlying layer may modify the natural lattice distance of the overlying material. In the context of material science and chemistry, morphology is the form or structure of different materials on an atomic level. For example, it is well known that carbon may exist in multiple structures (allotropes) such as diamond, where carbon atoms bond together in a tetrahedral lattice (crystalline type structure), and graphite, where carbon atoms bond together in sheets of a hexagonal lattice. Different allotropes of a material usually have different physical, electrical, optical, chemical, and other properties. In another example, materials may exhibit polymorphism, i.e. the ability of the material to present itself in different crystal forms and structures. Complex materials, such as metal oxides, used for electronic applications may exhibit polymorphism. Thus, such complex materials may be formed to have certain crystalline structures and inter-atomic lattice distances in order to provide desired electrical and physical properties.

Embodiments described herein may exhibit various types of morphology such as crystalline, polycrystalline, and amorphous. Some embodiments may exhibit an intermixed morphology. Crystalline structures are generally exhibited by a solid material whose constituent atoms or molecules are arranged in an ordered pattern extending in all three spatial dimensions. The atoms and/or molecules are interconnected and continue uniformly over a long distance, creating a well-ordered crystal lattice. If the crystal lattice extends continuously the full distance between the surfaces of the material (without being interrupted by grain boundaries), it may be referred to as a single-crystal (or mono-crystal). Thus, a crystalline material is made up of atoms in an orderly array.

In contrast, amorphous structures exhibit no recognizable long-range order such as is exhibited in crystalline structures. Thus, the constituent atoms and/or molecules in an amorphous material are randomly oriented and rarely interconnected so that there is no long-range ordering. "Ordering" is the regularity with which atoms appear in predictable locations in a lattice, as measured from a selected point of origin. In a perfectly-crystalline material, the location of each atom in the lattice can be determined by measuring from the point of origin. Conversely, in a more disordered structure (such as an amorphous solid), the location of the first tier (or perhaps a few tiers) of nearby atoms can be described with some degree of certainty, but the ability to accurately predict the locations of atoms then decreases dramatically moving away from the point of origin. Polycrystalline structures generally exhibit crystal grains separated by grain boundaries with no amorphous matrix between the crystal grains. Thus, the polycrystalline material is completely ordered in segments. An intermixed morphology may have regions of crystalline structures, such as micro-crystals, intermixed with amorphous regions. In order to detect the crystallinity of a material, a Focused Ion Beam (FIB) or other similar technique is used to cut the material. A material inspection technique, such as High-Resolution Transmission Electron Microscopy (HR-TEM) or Scanning Tunneling Microscopy (STM), is then able to show the atomic structure of the observed material. Other techniques like Selected Area Electron Diffraction (SAED) reveal the crystallinity of the material by observing the diffraction pattern. Due to the atomic resolution of these techniques each atomic layer can be discerned and thus the crystallinity of the material.

It is noted that relative directional terms used herein with regard to embodiments are for purposes of description only, and do not limit its scope as understood by persons skilled in the art. Specifically, directional terms such as "over," "above," "under," and the like are used in relation to a substrate upon which layers making up the embodiments described herein are formed, is a "bottom" element and is therefore "under" elements of the other layers of the embodiments formed thereon.

In some embodiments, a nonvolatile memory element includes a first layer formed on a substrate, a resistive switching layer formed on the first layer, and a second layer. The resistive switching layer is disposed between the first layer and the second layer and the resistive switching layer comprises a material formed with the same morphology as the first layer. The first layer morphology may be crystalline, polycrystalline, or amorphous and the resistive switching layer will have the same morphology. In some embodiments, if the first layer has a polycrystalline structure (morphology), the resistive switching element is formed on the first layer so that it will also have a polycrystalline structure. By controlling the morphology of the resistive switching layer, the conductivity of the resistive switching layer and other electrical and physical properties can be tailored as desired. The electrical and physical properties of the formed resistive switching layer are configured to lower the power required to change the resistive switching layer from a low resistance state (LRS) to a high resistance state (HRS) and vice-versa, to increase device endurance and switching rate, and to decrease device variability. It is generally desirable to form the resistive switching layer so that its material and electrical properties will not degrade or breakdown during the often high current "burn-in" type device preparation steps, such as the "electrical forming" process, and also during normal repetitive operation of the nonvolatile resistive switching memory device. The general optimization of ReRam device performances may be addressed by the morphology control technique.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, which are referred to herein generally as electrodes 102 and 118, and are used to read from or write data into the memory devices 200. Electrodes 102 and 118 generally include one or more conductive layers, each conductive layer having a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200. Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope described herein.

Figure 2A:
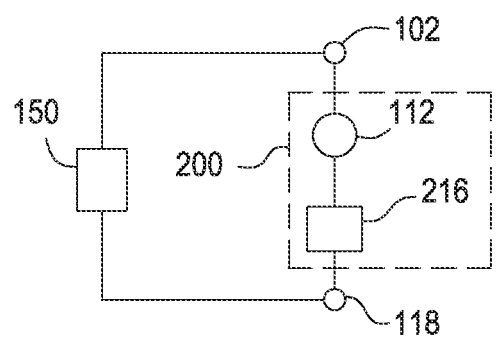
FIG. 2A is a schematic view of a memory device.

FIG. 2A schematically illustrates an example of some embodiments of a switching memory device 200 that contains a memory element 112 and an optional current steering device 216, which are both disposed between the electrodes 102 and 118. In some embodiments, the current steering device 216 is an intervening electrical component, such as a p-n junction diode, p-i-n diode, transistor, or other similar device that is disposed between electrode 102 and memory element 112, or between the electrode 118 and memory element 112. In some embodiments, the current steering device 216 may include two or more layers of semiconductor material, such as two or more doped silicon layers, that are configured to allow or inhibit the current flow in different directions through the memory element 112 when that memory element is dormant, i.e. not selected to read.

Figure 2B:
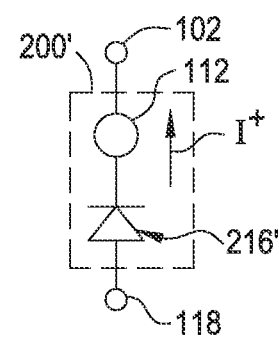
FIG. 2B schematically illustrates a memory device configured to allow current to flow through the memory device in a forward direction.

FIG. 2B schematically illustrates another switching memory device 200' that contains a memory element 112 and a diode type current steering device 216' that preferentially allows current to flow through the memory device 200 in a forward direction ("I+"). However, due to the design of the current steering device 216', a reduced current can also flow in the opposing direction through the device by the application of a reverse bias to the electrodes 102 and 118.

Figure 2C:
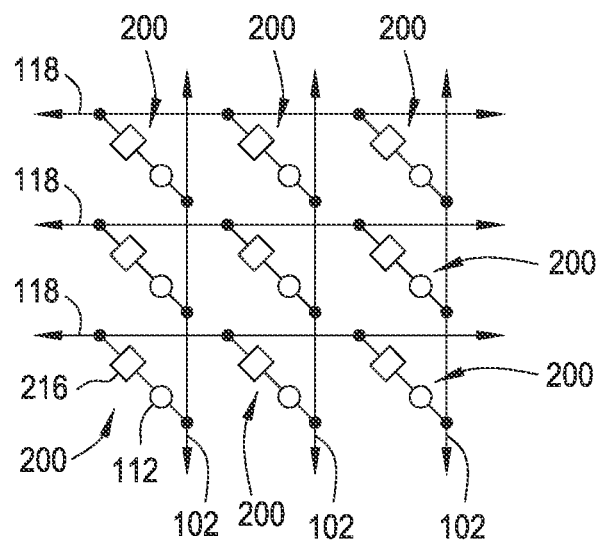
FIG. 2C is schematic representation of an array of memory devices.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 is formed.

Figure 2D:
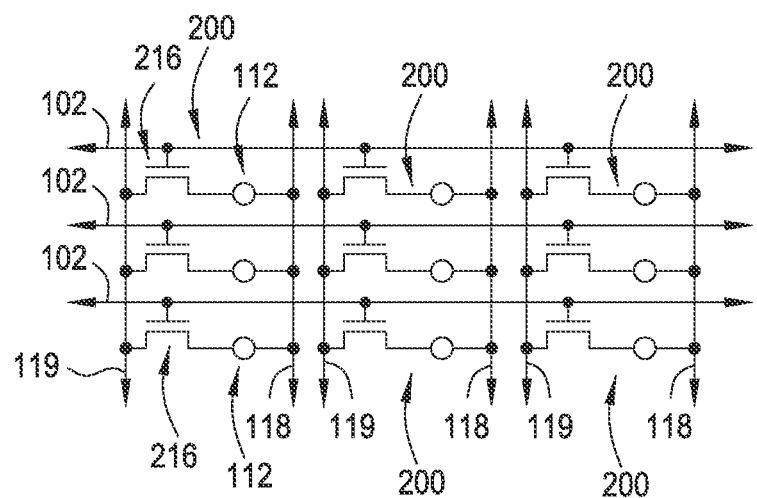
FIG. 2D is schematic representation of another array of memory devices.

FIG. 2D schematically illustrates an example of some embodiments of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119. The source-lines 119 generally comprise one or more patterned conductive layers (e.g., metal) that are adapted to provide a desired amount of current to the memory element 112 when the transistor in the current steering device is turned "on". The electrodes 102, electrodes 118 and source-lines 119 are typically biased by circuitry that is connected at the periphery of the memory chip on which the array of memory devices 200 is formed.

During operation, such as a read operation, the state of a memory element 112 in the switching memory device 200 can be sensed by applying a sensing voltage (i.e., a "read" voltage $V_{READ}$ (FIG. 3)), such as applying about +0.5 volts (V), to an appropriate set of electrodes 102 and 118. Depending on its history, a memory element that is addressed in this way may be in either a high resistance state (HRS) or a low resistance state (LRS). The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

Figure 3:
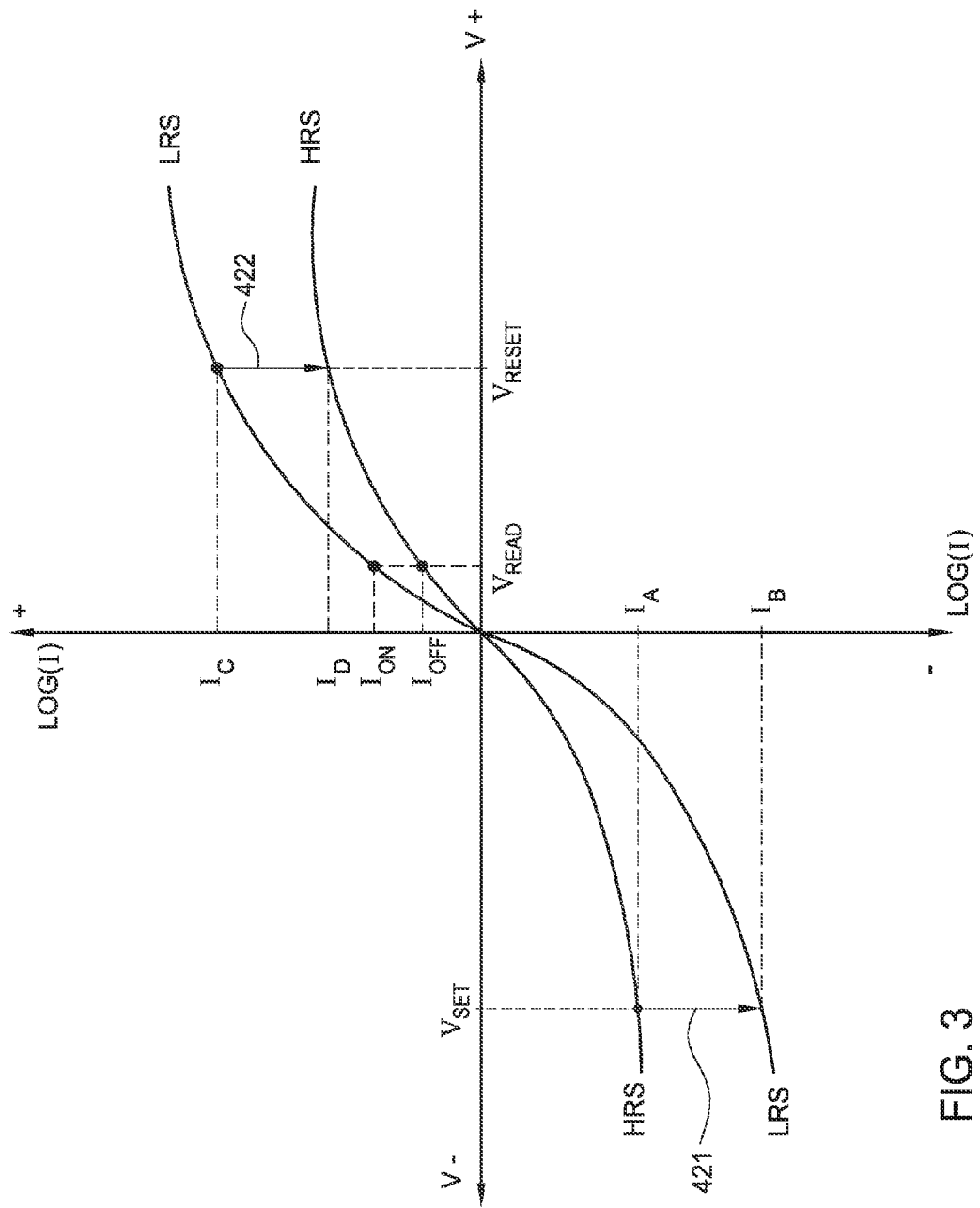
FIG. 3 schematically illustrates exemplary log-log plots of measured current (I) values versus applied voltages (V) of an exemplary embodiment of a memory device having a resistive switching memory element.

In some embodiments, the memory element 112 uses bipolar switching where opposite polarity set and reset voltages are used to alter the resistance of the memory element between high and low resistance states. FIG. 3 schematically illustrates a log-log plot of current (I) versus voltage (V) of one example of the low-resistance-state (LRS) and high-resistant-state (HRS) curves of a memory element 112 having these two bistable resistive states. The voltage levels $V_{SET}$ and $V_{RESET}$, shown in FIG. 3, illustrate typical threshold values used to "set" and "reset" the contents of a memory element 112. In one example, initially, memory element 112 may be in a high resistance state (e.g., storing a logic "zero"). The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118. In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated") or defects in the resistive switching layer 206 (FIG. 4, 6A, or 8A) of memory element 112 when the memory device 200 is reverse biased. The defects or traps, which are commonly thought to be oxygen vacancies, may be formed during the deposition and/or post-processing of the resistive switching layer 206. For example, the defects may be created by a non-stoichiometric material composition found in the formed resistive switching layer 206. In embodiments in which a novel resistive switching layer comprises a metal nitride or metal oxide-nitride, it is believed that the defects or traps that provide multiple resistance capability for the resistive switching layer may be nitrogen vacancies.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112. When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied. Voltage pulses can be used in the programming of the memory element 112. For example, a 1 microseconds (μs) to 1 nanoseconds (ns) square or trapezoidal shaped pulse can be used to switch the memory element 112. In some embodiments, it may be desirable to adjust the length of the pulse depending on the amount of time needed to switch the memory element 112. In one example, the "set" and "reset" pulses are each about 10 ns in length. While the discussion of the memory element 112 herein primarily provides bipolar switching examples, some embodiments of the memory element 112 may use unipolar switching, where the set and reset voltages have the same polarity.

FIG. 4A is a schematic cross-sectional view of an un-optimized switching memory device 200, which contains a memory element 112 and a current steering device 216 (e.g., a diode) that is formed over a substrate 201. In this configuration, the memory element 112 generally contains a top electrode 102, resistive switching layer 206, and intermediate electrode 210. FIG. 4B schematically illustrates an electrical circuit formed in the switching memory device 200 shown in FIG. 4A. As illustrated in FIG. 4B, the electrical circuit within the standard switching memory device 200 includes a top electrode impedance (i.e., resistance $R_{TEL}$) created by the material layer(s) in the top electrode 102, a resistive switching layer impedance (i.e., resistance $R_{RSL}$) created by the material layer(s) in the resistive switching layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118. The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The resistive switching layer 206 can be a dielectric material, such as a metal oxide material or other similar material that can be switched between at least two or more stable resistive states. In some embodiments, the high and low resistance states of the resistive switching layer 206 may be about 2.5 MΩ and about 100 kΩ, respectively. One will note that it is assumed that the contact resistances between the various layers in the switching memory device, such as the contact resistance formed between the electrode 102 and the resistive switching layer 206, are negligible to help reduce the complexity of the discussion of the circuit. While the current steering device 216 may include two or more layers of semiconductor material that are adapted to control the flow of current through the formed memory device 200, the resistance of each of the components in the current steering device 216 are not individually discussed herein to minimize the complexity of the discussion, and thus an overall current steering device resistance $R_{CSD}$ is used to represent the overall impedance of the current steering device 216.

Embodiments described provide a resistive switching layer 206 formed on a first layer, which first layer is formed on a substrate 201. The resistive switching layer 206 comprises a material having the same morphology as the layer on which it is formed. By controlling the morphology of the resistive switching layer 206, such as by forming the resistive switching layer 206 to be an ultra-thin layer on an electrode, the conduction of the resistive switching layer 206 can be controlled. The resistive switching layer 206 is disposed between the first layer and the second layer, wherein the resistive switching layer comprises a material formed with the same morphology as the first layer.

In general the conduction properties of a material are related to the morphology of the material, such that in a film with long order range, conduction is easier compared to a film with short order range or no order at all, assuming similar film thicknesses. For example, the conduction in the grain boundaries in between poly-crystals can be assisted by the highly defective paths so that they become the main conductive regions. A perfect crystalline material can give origin to a semiconductor behavior while an amorphous material can give origin to an insulator behavior (of course the presence of defects in an amorphous material can create a conduction band like in a semiconductor conductor but with different conduction properties). Additionally, diffraction, reflectivity, transmission, absorption and pairs generation properties are related to the morphology of the material.

Figure 5:
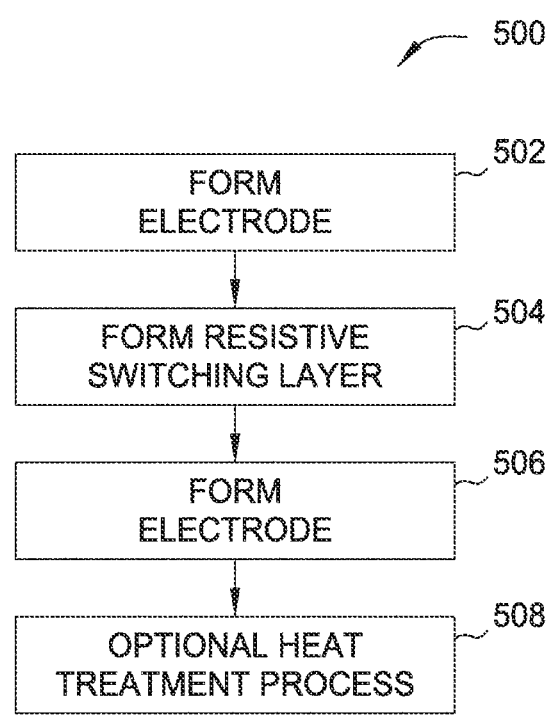
FIG. 5 is a process flow diagram illustrating the step for forming the switching memory device according to one embodiment.

FIG. 5 is a process flow diagram of a process 500 (method) for forming the switching memory device 200. Although the method steps are described in conjunction with memory device 200 in FIG. 4A, persons skilled in the art will understand that other resistive switching memory devices may be formed using process 500. It is also noted that the process for forming the current steering device is not shown in FIG. 5.

Process 500 begins at step 502 in which an electrode is formed on or over substrate 201, which may be electrode 118 or intermediate electrode 210. In one embodiment the first layer is an electrode, such as the bottom electrode 118 or intermediate electrode 210 shown in FIG. 4A. The electrodes 102, 210, and 118 are generally formed from a conductive material, such as a highly conductive semiconductor material (e.g., p-type polysilicon, n-type polysilicon) and/or metal (e.g., TiN, Al, W). In one embodiment, electrodes 118 or 210 are a highly doped polysilicon layers that are formed on or over substrate 201 using a conventional CVD or ALD type polysilicon deposition technique. In one embodiment, electrode 118 and/or electrode 210 comprises polysilicon, and is between about 50 and about 5000 Å thick. The first layer has a morphology that is crystalline, polycrystalline, or amorphous. The morphology of the first layer may be controlled in different ways. In some embodiments, if the electrode 118 is a thin layer, its morphology is determined by the morphology of the underlying substrate 201. However, if the electrode 118 is thick enough to be independent from the morphology of the underlying substrate 201, then its morphology is controlled by the deposition technique parameters (temperature, speed, precursors, etc.) and by the kind of material used for the electrode 118. For example, pure single-crystal materials like silicon or copper can be obtained under particular deposition techniques, e.g. Czochralski and/or Bridgman processes. Polysilicon is generally made of polycrystals whose percentage and size can be controlled during the deposition process. Generic metals like TiN and Al generally have a polycrystalline morphology with cubic crystal structure. A special class of metals is the so called metallic glass, characterized by an amorphous structure.

In step 504, resistive switching layer 206 is formed on or over an electrode, such as electrode 118 or intermediate electrode 210, using one or more deposition processes. Resistive switching layer 206 comprises a dielectric material that can be switched between two or more stable resistive states. In some embodiments, resistive switching layer 206 is an ultra-thin layer that has a thickness of less than about 5 nanometers (nm), such as from about 2 nm to about 3 nm. Conventional resistive switching layers are generally between 20 to 30 nm thick, thus some embodiments provide resistive switching layers that generally may be an order of magnitude thinner than conventional films.

It is believed that for ReRAM devices, the morphology of the switching layer can control the mobility of the oxygen vacancies that are most likely responsible for the creation and/or dissolution of the conduction path between the electrodes and through the switching layer. In general, the ability to control the morphology, and thus the mobility of oxygen vacancies of a material, has an impact on electron conduction and ion conduction through the material. Moreover, the morphology can control the heat diffusion into the surrounding area of the switching event. This can be a very important property due to the fact that all the physical and/or chemical mechanisms at the origin of the resistive-switching are thermally activated. For these reasons, control of the material morphology can be considered another "knob" that can be used to tailor the switching performances in various memory devices.

Controlling the morphology of a layer may have other applications in addition to switching layers in nonvolatile memory devices. In the case of a resistor, the morphology can be tuned to not only have the desired resistivity, but to also have the desired mechanism of conduction. In the case of a capacitor, the morphology can help minimize the current leakage. In the case of a power device, controlling the morphology can help toward better power dissipation. In the case of CBRAM devices, the conduction path is also created by the movement of high mobility ions coming from one active electrode (e.g. Cu or Ag) into a solid-state electrolyte. Thus, controlling the morphology of layers in CBRAM devices may also improve the ability to control ion mobility as desired.

The morphology of the switching layer can control the mobility of the oxygen vacancies that are most likely responsible for the creation and/or dissolution of the conduction path between the electrodes and through the switching layer. It is believed that a similar mechanism can be considered in CBRAM devices in which the conduction path is created by the movement of high mobility ions coming from one active electrode (e.g. Cu or Ag) into a solid-state electrolyte.

The resistive switching layer 206 may be formed using CVD, ALD, or similar processes that provide precise layer control. During the formation process, the resistive switching layer 206 may be formed by depositing one or more layers on the electrode on the order of a single monolayer in thickness. The first monolayer of the resistive switching layer 206 will match the morphology of the underlying layer. Each subsequent monolayer will also match the morphology of its underlying layer at least up to a certain thickness. If the resistive switching layer becomes too thick, then it will have a morphology that may be different than and independent of the underlying first layer. Thus, an ultra-thin resistive switching layer will have the same morphology as the underlying layer. Substantially the entire resistive switching layer has the same morphology as the underlying layer.

Numerous materials have been explored for possible use in resistive switching layers for nonvolatile resistive memory devices, including various oxides and all of the transition metals, e.g., aluminum (Al), hafnium (Hf), zirconium (Zr), titanium (Ti), tantalum (Ta), nickel (Ni), copper (Cu), tungsten (W), iron (Fe), vanadium (V), niobium (Nb), tungsten (W), and the like. Some examples of suitable metal oxides for use as a resistive switching layer 206 include $AlO_x$, $HfO_x$, and $TiO_x$.

Resistive switching layer 206 may also include a two-metal oxide, a metal nitride, a metal oxide-nitride, a two-metal oxide-nitride, or a multilayer stack thereof. In general, materials like phase change chalcogenides, perovskite, solid-state electrolytes, and organic compounds whose layer is similar to a poly-crystalline type may also be used.

Metal nitrides suitable for use as a resistive switching layer 206 include $HfN_x$, $ZrN_x$, $SiN_x$, $AlN_x$, $TiN_x$, $V_xN_y$ (e.g., $V_2N$), $NbN_x$ (e.g. $Nb_2N$, $Nb_4N_3$, $NbN$), $WN_x$ (e.g., $WN_2$), among others. Suitable metal nitrides can be formed by atomic layer deposition (ALD) processes.

Metal oxide-nitrides suitable for use as resistive switching layer 206 include $HfO_xN_y$, $ZrO_xN_y$, $AlO_xN_y$, and $TaO_xN_y$, among others. As used herein, the term "metal oxide-nitride" refers to a material that is a combination of metal oxides and metal nitrides, in contrast with metal oxynitrides, in which the metallic chemical element is bonded with the ON structure. According to embodiments of the invention, such metal oxide-nitride films can be deposited in various ALD processes that are described below in conjunction with FIGS. 6A-9.

Two-metal oxide-nitrides suitable for use as resistive switching layer 206 have two metallic or semi-metallic elements and include films such as: $Hf_xSi_yO_zN_{(1-x-y-z)}$, $Zr_xSi_yO_zN_{(1-x-y-z)}$, $Hf_xZr_yO_zN_{(1-x-y-z)}$, and $Hf_xAl_yO_zN_{(1-x-y-z)}$. Two-metal oxide-nitrides may be deposited by a series of ALD processes similar to that used for the deposition of metal oxide-nitrides. Such ALD processes are described below in conjunction with FIGS. 6A-9. Suitable metals for such two-metal oxide-nitrides include hafnium (Hf), zirconium (Zr), aluminum (Al), tantalum (Ta), titanium (Ti), vanadium (V), niobium (Nb), and tungsten (W) and suitable semi-metallic elements include silicon (Si).

As previously stated, the resistive switching layer has the same morphology as the first layer. It is believed that this is achieved by forming the resistive switching layer as an ultra-thin layer having a thickness less than about 5 nm. In the example of some embodiments shown in FIG. 4A, where the first layer is the intermediate electrode 210, the resistive switching layer 206 has the same morphology as the intermediate electrode 210. In some embodiments, if the intermediate electrode 210 comprises a crystalline doped polysilicon, then the resistive switching layer 206 also is crystalline. If the intermediate electrode 210 comprises a TiN material having a polycrystalline morphology, then the resistive switching layer 206 also comprises a material having a polycrystalline morphology.

Figure 6E:
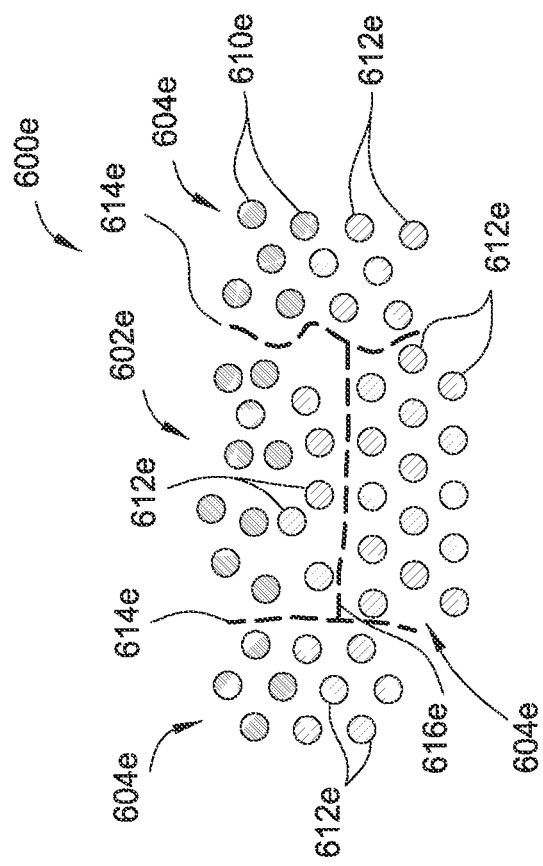
FIG. 6E is a schematic depiction of a resistive switching layer and an underlying layer, each having an intermixed morphology.

FIGS. 6A-6E illustrate the different morphologies the resistive switching layer and the first layer may have. FIG. 6A schematically illustrates the first layer and the resistive switching layer at an atomic level. In this example of some embodiments, the first layer 612a has a crystalline structure 600a. As the resistive switching layer 610a, shown in the darker shading, is formed thereon, it will match the morphology of the underlying layer and also have a crystalline structure 600a. Although both layers have a crystalline structure, the crystalline structure of the resistive switching layer 610a may or may not have the same inter-atomic distance as the underlying crystalline layer, i.e. the first layer 612a. Generally, the inter-atomic distance is considered to be the distance between atoms in a lattice structure. Thus, although both layers may be crystalline, they may have lattice structures with different interatomic distances. Even when the crystalline structures of the two layers have differing interatomic distances in their lattice structures, their morphologies are still considered to be the same as each layer has a crystalline morphology. FIG. 6B schematically illustrates an amorphous structure 600b where the resistive switching layer 610b, shown in the darker shading has the same amorphous morphology as the first layer 612b as it is formed thereon. As such, both the first layer 612b and the resistive switching layer 610b have an amorphous structure. FIG. 6C schematically illustrates a polycrystalline structure 600c. In this example of some embodiments, the resistive switching layer 610c, shown in the darker shading, and the first layer 612c each have a polycrystalline structure. Dashed lines 614c represent the grain boundaries between individual crystals in the polycrystalline structure 600c. The morphologies of the first layer 612c and the resistive switching layer 610c are the same in that the grain boundaries in the polycrystalline structure of the first layer 612c match the grain boundaries formed in the polycrystalline structure of the resistive switching layer 610c.

Figure 6D:
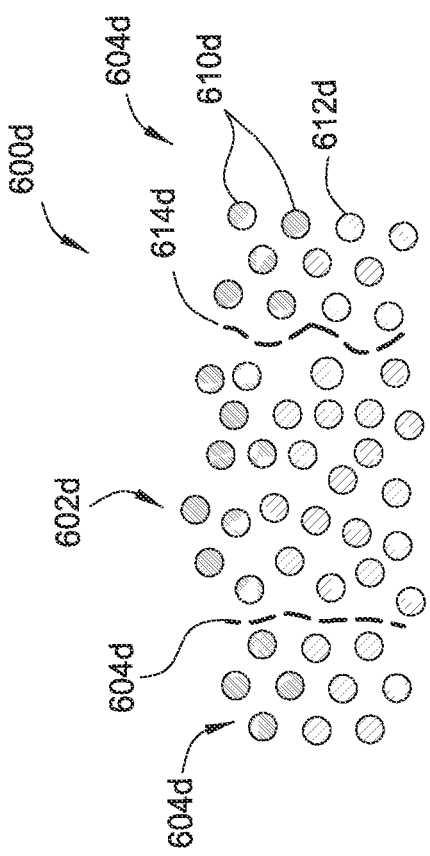
FIG. 6D is a schematic depiction of a resistive switching layer and an underlying layer, each having an intermixed morphology.

FIGS. 6D and 6E illustrate some embodiments having layers exhibiting intermixed morphological structures. In some embodiments, the first layer and the resistive switching layer may have portions that exhibit a crystalline structure mixed with portions that exhibit an amorphous structure. Embodiments having an intermixed morphology may be described as having a degree of crystallinity, such as 80% crystalline. Crystallinity of a film expressed as a percentage indicates that some portions of the layer have amorphous regions intermixed with crystalline regions. Generally, the percentage of crystallinity is an average number of crystalline structures present in a fixed area/volume of the film.

FIG. 6D illustrates an example of some embodiments of an intermixed morphology 600d, portions of which exhibit an amorphous structure 602d and portions of which exhibit a crystalline structure 604d. In this example, the resistive switching layer 610d, shown in the darker shading, and the first layer 612d each have portions that are amorphous 602d and portions that are crystalline 604d. Dashed lines 614d represent the grain boundaries between the amorphous structure 602d and the crystalline structure 604d of the intermixed morphology 600d. The morphologies of the first layer 612d and the resistive switching layer 610d are the same in that the grain boundaries in the intermixed structure 600d of the first layer 612d match the grain boundaries formed in the intermixed structure of the resistive switching layer 610d. Additionally, when the degree of crystallinity is the same for the first layer 612d and the resistive switching layer 610d, as shown in FIG. 6d, then the first layer 612d and resistive switching layer 610d have the same morphology.

FIG. 6E illustrates an example of some embodiments of an intermixed morphology 600e, portions of which exhibit an amorphous structure 602e and portions of which exhibit a crystalline structure 604e. In this example, the resistive switching layer 610e, shown in the darker shading, and the first layer 612e each have portions that are amorphous 602e and portions that are crystalline 604e. Dashed lines 614e and 616e represent the grain boundaries between the amorphous structure 602e and the crystalline structure 604e of the intermixed morphology 600e. This example also illustrates a portion of the first layer 612e exhibiting an amorphous structure 602e, as shown in the region between the two grain boundaries 614e and above the grain boundary 616e. This amorphous structure 602e of the first layer 612e is above a crystalline structure 604e of the first layer 612e, as shown in the region between the two grain boundaries 614e and below the grain boundary 616e. In this example, the switching layer 610e exhibits the same amorphous structure 602e as the first layer 612e, as shown in the region between the two grain boundaries 614e and above the grain boundary 616e. The morphology of the resistive switching layer 610e will have the same morphology as that of the underlying first layer 612e at its top surface, despite that the underlying first layer 612e may have a different morphology below the top surface of the first layer 612e, as illustrated in FIG. 6E. The top surface of the first layer 612e may be one or two atomic layers thick. The top surface may also be characterized as the portion of the underlying layer where the gases of the ALD cycles react.

In an intermixed ultra-thin film layer, the morphology of the both first layer and the resistive switching layer may be determined by using material inspection techniques, for example comparing an XRD analysis of the ultra-thin film layer with an XRD analysis of the portion of first layer that is adjacent the ultra-thin film layer. In each of these examples of some embodiments, the resistive switching layers 610a, 610b, 610c, 610d, 610e may be a metal oxide while the first layers 612a, 612b, 612c, 612d, 612e may be the underlying electrode.

The different morphologies create different physical and electrical properties in the resistive switching layer 206. For example, crystalline structures have a certain kind of conductivity, while polycrystalline structures provide conductivity through grain boundaries. The first layer may be selected to provide a particular morphology to the resistive switching layer 206. Generally, if a ReRAM device requiring lower power and lower variability is desired, a crystalline structure may be chosen because of its ordered and well defined structure to likely provide lower power and lower variability. During device formation, it may be necessary to apply certain voltages to make a conductive path through the resistive switching layer. The amount of voltage required to form the conductive path may vary from device to device, creating device variability. Thus, a crystalline structure may lower the variability in performance and programming of the device. A polycrystalline structure may be selected if a ReRAM device providing better retention and lower power requirements is desired. However, polycrystalline structures may also increase resistive-switching variability related to the presence of multiple conductive paths in parallel, i.e. along the grain boundaries. An amorphous material may provide a better thermal confinement, thus lowering the energy barrier for the resistive-switching process. The particular morphology may also be chosen to improve the number of cycles a device may cycle between resistive states before failure.

In step 506, electrode 102 is formed above resistive switching layer 206 as shown in FIG. 4A using one or more of the materials suitable for electrode 102 listed above in conjunction with FIG. 4A. Electrode 102 may be formed using a deposition process, such as PVD, CVD, ALD or other similar processes. In one embodiment, electrode 102 is between about 500 Å and 1 μm thick.

In optional step 508, formed memory device 200 is thermally processed, e.g., via an anneal process. Temperature and duration of the anneal process is a function of the configuration of memory device 200 as well as the materials included in memory device 200. For example, in some embodiments, the anneal process takes place at a temperature of greater than about 200° C. In other embodiments, the anneal process takes place at a temperature of greater than about 600° C. In yet other embodiments, the anneal process takes place at a temperature of greater than about 1000° C. Duration of the anneal process can also vary greatly, e.g. varying between about 30 seconds and 20 minutes depending on the configuration of memory device 200. Furthermore, vacuum anneals, oxygen anneals, anneals using gas mixtures, such as a hydrogen/argon mixture, and other anneal processes known in the art fall within the scope of the invention. Similarly, multiple thermal processing steps may be performed on memory device 200. In some embodiments, a thermal process may be performed during or after multiple steps of method 500. The process(es) performed at step 508, are generally configured to cause the layers disposed in the switching memory device 200 to form a desirable interface between adjacent layers as well as activate and/or desirably process the other layers formed in the switching memory device.

Figure 7:
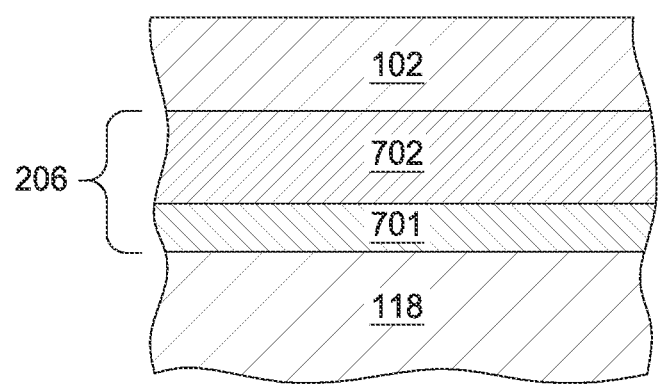
FIG. 7 schematically illustrates a cross-sectional view of a resistive switching layer formed according to an embodiment.

FIG. 7 schematically illustrates a cross-sectional view of a resistive switching layer formed according to some embodiments. The resistive switching layer 206 in a nonvolatile memory device 200 may comprise multiple sub-layers as shown in FIG. 7. Resistive switching layer 206 is formed on the first layer, such as electrode 118, and the second layer, such as electrode 102, is formed so that the resistive switching layer 206 is disposed between the first layer and the second layer.

The resistive switching layer 206 may comprise two or more sub-layers 701, 702 having different morphologies. The first sub-layer 701 comprises a material formed with the same morphology as the first layer, such as electrode 118. The second sub-layer 702 comprises a material formed with a morphology that is either the same as or different than the first sub-layer 701 and the first layer, such as electrode 118. In some embodiments, the first layer (e.g. electrode 118) and the first sub-layer 701 may have a polycrystalline morphology and a thickness of about 5 nm or less. The second sub-layer, however, may have a polycrystalline or a crystalline morphology, and a thickness of about 30 nm or less. In some embodiments, the second sub-layer 702 may be 5 nm or less so that it will have the same structure of sub-layer 701 e.g. both sub-layers 701 and 702 are polycrystalline. In some embodiments, the sub-layer 702 may be thick enough to form a crystalline structure that is independent from sub-layer 701, e.g. around 30 nm, although the actual thickness required to form an independent sub-layer will depend on the material used. The first sub-layer 701 and second sub-layer 702 may comprise the materials previously discussed in relation to the resistive switching layer 206, although each sub-layer comprises different materials in order to form each sub-layer with different morphologies. The morphology control of these two layers provides an extra "knob" to improve switching performance.

Embodiments described provide the ability to tailor the electrical properties and switching characteristics of a resistive switching layer. A resistive switching layer is formed as an ultra-thin layer to have a morphology matching the underlying layer, such as an electrode. By providing a resistive switching layer with the same morphology of the underlying layer the resistive switching layer may be easier to switch and/or provide better resistive state retention compared to conventional switching films. Additionally, the films formed according to embodiments described may be formed entirely in-situ (in one processing chamber), thereby simplifying processing steps and decreasing processing times. Moreover, as memory devices continue to decrease in size, ultra-thin resistive switching layers provide a means of scaling memory devices to achieve smaller sizes.

The foregoing embodiments are merely illustrative of the principles and various modifications that can be made by those skilled in the art without departing from the scope and spirit of the invention as defined by the claims that follow.

The invention claimed is:

1. A nonvolatile memory element, comprising:
a first layer on a substrate;
a resistive switching layer on the first layer;
a second layer; wherein the resistive switching layer is disposed between the first layer and the second layer, and wherein the resistive switching layer comprises a material having the same morphology as a top surface of the first layer;
a first sub-layer that comprises the material having the same morphology as a top surface of the first layer; and
a second sub-layer comprising a material having a morphology that is different than the first sub-layer and the first layer, wherein the first layer and the first sub-layer each have a polycrystalline morphology and the second sub-layer has a crystalline morphology.

2. The nonvolatile memory element of claim 1, wherein the morphology of the first layer and the resistive switching layer is crystalline, polycrystalline, amorphous, or intermixed.

3. The nonvolatile memory element of claim 1, wherein the resistive switching layer has a thickness of about 5 nanometers (nm) or less.

4. The nonvolatile memory element of claim 3, wherein the resistive switching layer has a thickness from about 2 nm to about 3 nm.

5. The nonvolatile memory element of claim 1, wherein the resistive switching layer comprises a metal oxide layer, a two-metal oxide layer, a metal nitride layer, a metal oxide-nitride layer, a two-metal oxide-nitride layer, or a combination thereof.

6. The nonvolatile memory element of claim 5, wherein the metal of the metal oxide layer comprises one or more of aluminum (Al), hafnium (Hf), zirconium (Zr), titanium (Ti), tantalum (Ta), nickel (Ni), copper (Cu), tungsten (W), iron (Fe), vanadium (V), niobium (Nb), or tungsten (W).

7. The nonvolatile memory element of claim 5, wherein the resistive switching layer comprises at least one or more of $AlO_x$, $HfO_x$, $TiO_x$, $AlN_x$, $AlO_xN_y$, $HfN_x$, $ZrN_x$, $SiN_x$, $HfO_xN_y$, $ZrO_xN_y$, $AlO_xN_y$, $TaO_xN_y$, $Hf_xSi_yO_zN_{(1-x-y-z)}$, $Zr_xSi_yO_zN_{(1-x-y-z)}$, $Hf_xZr_yO_zN_{(1-x-y-z)}$, or $Hf_xAl_yO_zN_{(1-x-y-z)}$.

8. The nonvolatile memory element of claim 1, wherein the first layer comprises an electrode comprising a conductive metal.

9. The nonvolatile memory element of claim 1, wherein the second layer is a bottom electrode comprising one or more of p-type polysilicon, n-type polysilicon, titanium, aluminum, or tungsten.

10. The nonvolatile memory element of claim 1, wherein the second sub-layer has a thickness of about 5 nanometers (nm) or less.

11. The nonvolatile memory element of claim 1, wherein the second sub-layer comprises a metal oxide layer, a two-metal oxide layer, a metal nitride layer, a metal oxide-nitride layer, a two-metal oxide-nitride layer, or a combination thereof.

12. The nonvolatile memory element of claim 11, wherein the metal comprises one or more of aluminum (Al), hafnium (Hf), zirconium (Zr), titanium (Ti), tantalum (Ta), nickel (Ni), copper (Cu), tungsten (W), iron (Fe), vanadium (V), niobium (Nb), or tungsten (W).

13. The nonvolatile memory element of claim 11, wherein the second sub-layer comprises one or more of $AlO_x$, $HfO_x$, $TiO_x$, $AlN_x$, $AlO_xN_y$, $HfN_x$, $ZrN_x$, $SiN_x$, $HfO_xN_y$, $ZrO_xN_y$, $AlO_xN_y$, $TaO_xN_y$, $Hf_xSi_yO_zN_{(1-x-y-z)}$, $Zr_xSi_yO_zN_{(1-x-y-z)}$, $Hf_xZr_yO_zN_{(1-x-y-z)}$, or $Hf_xAl_yO_zN_{(1-x-y-z)}$.

14. A method of forming a nonvolatile memory element in a ReRAM device, the method comprising:
   forming a resistive switching layer on a first layer; and
   forming a second layer, so that the resistive switching layer is disposed between the first layer and the second layer, wherein the resistive switching layer comprises a material having the same morphology as a top surface of the first layer;
   forming a first sub-layer on the first layer, the first sub-layer comprising the material formed with the same morphology as a top surface of the first layer; and
   forming a second sub-layer on the first sub-layer, the second sub-layer comprising a material formed with a morphology that is different than the first sub-layer and the first layer, wherein the first layer and the first sub-layer have a polycrystalline morphology and the second sub-layer has a crystalline morphology.

15. The method of claim 14, wherein the morphology of the first layer and the resistive switching layer is crystalline, polycrystalline, amorphous, or intermixed.

16. The method of claim 14, wherein the resistive switching layer has a thickness of about 5 nanometers (nm) or less.

* * * * *